(12) United States Patent
Alam et al.

(10) Patent No.: US 9,997,239 B1
(45) Date of Patent: Jun. 12, 2018

(54) WORD LINE OVERDRIVE IN MEMORY AND METHOD THEREFOR

(71) Applicant: EVERSPIN TECHNOLOGIES, INC., Chandler, AZ (US)

(72) Inventors: Syed M. Alam, Austin, TX (US); Yaojun Zhang, Austin, TX (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 0 days. days.

(21) Appl. No.: 15/584,232

(22) Filed: May 2, 2017

(51) Int. Cl.
| | | |
|---|---|---|
| *G11C 11/16* | (2006.01) | |
| *G11C 11/56* | (2006.01) | |
| *G11C 11/419* | (2006.01) | |
| *H01L 27/11* | (2006.01) | |
| *H01L 43/02* | (2006.01) | |
| *H01L 43/08* | (2006.01) | |
| *H01L 43/12* | (2006.01) | |

(52) U.S. Cl.
CPC ........ *G11C 11/5607* (2013.01); *G11C 11/161* (2013.01); *G11C 11/1675* (2013.01); *G11C 11/419* (2013.01); *H01L 27/11* (2013.01); *H01L 43/02* (2013.01); *H01L 43/08* (2013.01); *H01L 43/12* (2013.01)

(58) Field of Classification Search
CPC ............................ G11C 11/16; G11C 11/1675
USPC .................................................. 365/173, 158
See application file for complete search history.

(56) References Cited

U.S. PATENT DOCUMENTS

| | | | | |
|---|---|---|---|---|
| 6,567,299 | B2 * | 5/2003 | Kunikiyo | ............... B82Y 10/00 365/158 |
| 8,391,047 | B2 * | 3/2013 | Maejima | ............ G11C 13/0004 365/148 |
| 8,792,269 | B1 | 7/2014 | Abedifard et al. | |
| 8,885,428 | B2 * | 11/2014 | Chen | .................... G11C 13/004 365/148 |
| 9,401,194 | B2 | 7/2016 | Abedifard et al. | |
| 9,558,802 | B2 | 1/2017 | Abedifard et al. | |
| 9,691,464 | B2 | 6/2017 | Abedifard et al. | |
| 9,786,344 | B1 | 10/2017 | Abedifard et al. | |

(Continued)

*Primary Examiner* — Michael Tran
(74) *Attorney, Agent, or Firm* — Bookoff McAndrews, PLLC

(57) ABSTRACT

Higher word line voltages facilitate write operations in spin-torque magnetic memory devices, but overdriving the gate of a selection transistor with such higher word line voltages can damage the selection transistor if the gate-to-source voltage for the selection transistor is too high. Therefore in order to support the word line voltage needed on the gate of the select transistor for an up-current write operation without exceeding limits on the gate-to-source voltage for the select transistor, the gate of the selection transistor can be driven in a two-step process. The gate of the selection transistor is first driven to a lower voltage within the limits of the gate-to-source voltage for the transistor when the source of the transistor is grounded or at a voltage near ground. A voltage is then applied across the memory cell, which results in the source of the selection transistor being raised above its initial ground or near-ground state. After the source of the selection transistor has been raised, the gate voltage of the selection transistor can also be raised at least as much as the source of the selection transistor has been elevated without violating the limits on the gate-to-source voltage for the selection transistor.

20 Claims, 5 Drawing Sheets

(56) References Cited

U.S. PATENT DOCUMENTS

| | | | |
|---|---|---|---|
| 9,858,977 B1 | 1/2018 | Abedifard et al. | |
| 2004/0196704 A1* | 10/2004 | Andrei | G09G 3/3486 |
| | | | 365/200 |
| 2006/0023497 A1* | 2/2006 | Kawazoe | G11C 13/0007 |
| | | | 365/158 |
| 2006/0050582 A1* | 3/2006 | Perner | G11C 7/062 |
| | | | 365/205 |
| 2007/0159898 A1* | 7/2007 | Lamorey | G11C 11/16 |
| | | | 365/200 |
| 2008/0247072 A1* | 10/2008 | Nozieres | G11C 11/16 |
| | | | 360/59 |
| 2010/0014346 A1* | 1/2010 | Lou | G11C 11/161 |
| | | | 365/171 |
| 2011/0157966 A1* | 6/2011 | Lee | G11C 11/1675 |
| | | | 365/158 |
| 2013/0148405 A1* | 6/2013 | Kang | G11C 5/06 |
| | | | 365/148 |
| 2014/0036573 A1* | 2/2014 | Ishihara | G11C 13/0021 |
| | | | 365/148 |
| 2014/0254250 A1* | 9/2014 | Mani | H01L 43/08 |
| | | | 365/158 |
| 2014/0293685 A1* | 10/2014 | Noguchi | G11C 11/1675 |
| | | | 365/158 |
| 2015/0294703 A1* | 10/2015 | Apalkov | H01L 43/08 |
| | | | 365/158 |
| 2016/0276031 A1* | 9/2016 | Abe | G11C 14/0081 |
| 2017/0178706 A1* | 6/2017 | Noguchi | G11C 11/1673 |

* cited by examiner

WORD LINE OVERDRIVE IN MEMORY AND METHOD THEREFOR

TECHNICAL FIELD

The disclosure herein relates generally to spin-torque magnetic memory devices and more particularly to circuits and methods for driving word lines in such memory devices.

BACKGROUND

Spin-torque magnetic memory devices store information by controlling the resistance across a magnetic tunnel junction (MTJ) such that a read current through the magnetic tunnel junction results in a voltage drop having a magnitude that is based on the state of the magnetoresistive stack. The resistance in each magnetic tunnel junction can be varied based on the relative magnetic states of the magnetoresistive layers within the magnetoresistive stack. In such memory devices, there is typically a portion of magnetoresistive stack that has a fixed magnetic state and another portion that has a free magnetic state that is controlled to be either of two possible states relative to the portion having the fixed magnetic state. Because the resistance through the magnetic tunnel junction changes based on the orientation of the free portion relative to the fixed portion, information can be stored by setting the orientation of the free portion. The information is later retrieved by sensing the orientation of the free portion. Such magnetic memory devices are well known in the art.

Writing to magnetic memory cells can be accomplished by sending a spin-polarized write current through the memory device where the angular momentum carried by the spin-polarized current can change the magnetic state of the free portion. One of ordinary skill in the art understands that such a current can either be directly driven through the memory cell or can be the result of applying one or more voltages, where the applied voltages result in the desired current. Depending on the direction of the current through the memory cell, the resulting magnetization of the free portion will either be parallel or antiparallel to the fixed portion. If the parallel orientation represents a logic "0", the antiparallel orientation may represent a logic "1", or vice versa. Thus, the direction of write current flow through the memory cell determines whether the memory cell is written to a first state or a second state. Such memory devices are often referred to as spin torque transfer memory devices. In such memories, the magnitude of the write current is typically greater than the magnitude of a read current used to sense the information stored in the memory cells.

In an array of magnetoresistive memory cells, each memory cell is often coupled to a corresponding selection transistor that allows each memory cell to be individually selected for access. The selection transistor for each memory cell is coupled in series with the memory cell between common lines that are often referred to as a "source line" and a "bit line." A word line is coupled to the gate of the selection transistor, thereby controlling current flow through the series circuit based on the voltages applied to the source and bit lines. In some instances, a higher word line voltage is needed in order to enable an appropriate amount of current flow through the memory cell that is sufficient to cause the free portion within the memory cell to change its magnetic orientation.

Therefore, it is desirable to provide techniques for supporting different word line voltages while ensuring proper memory device operation over an extended period of time.

DETAILED DESCRIPTION

Figure 1:
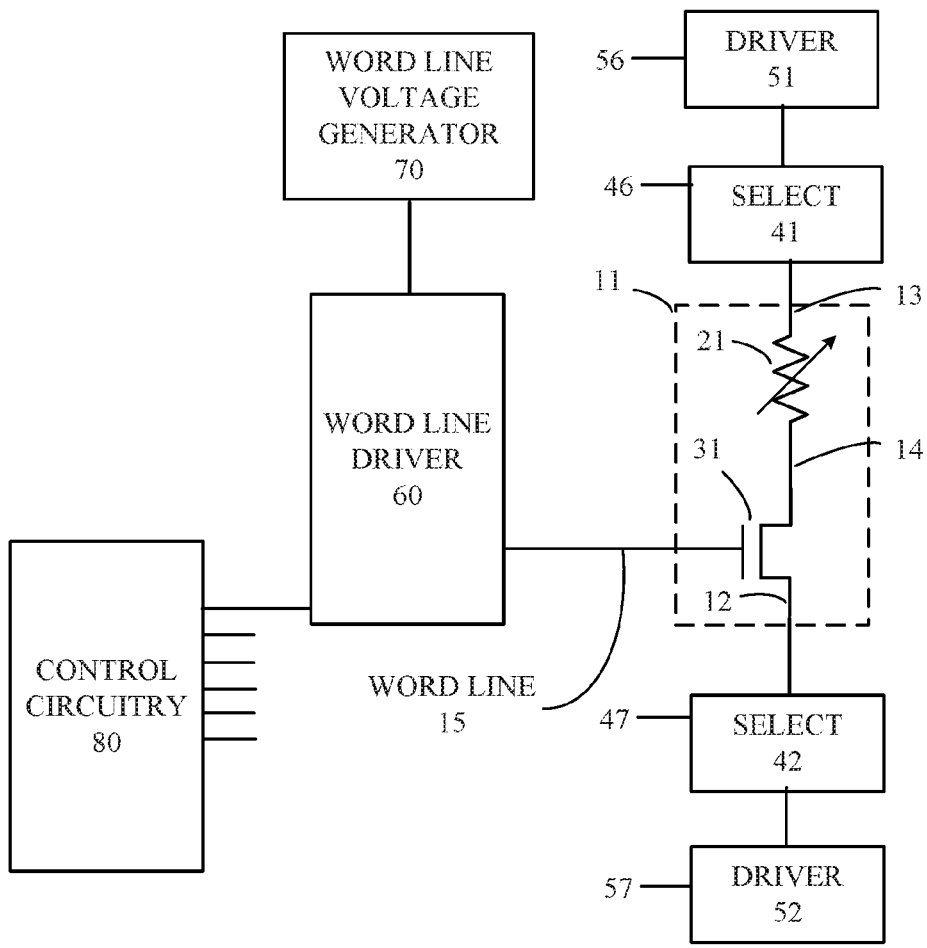
FIG. 1 is a block diagram corresponding to a down-current write in a spin-torque memory device in accordance with an exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to assist improve understanding of the example embodiments.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, generation of bias voltages, fundamental principles of magnetism, and basic operational principles of memory devices.

During the course of this description, like numbers may be used to identify like elements according to the different figures that illustrate the various exemplary embodiments.

For the sake of brevity, conventional techniques related to reading and writing memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Nonvolatile memory devices are often used in various applications in order to store data that remains valid after power is no longer applied. Examples of such nonvolatile memory devices include resistive memory devices such as MRAMs in which the resistance experienced by current flowing through the memory cell varies based on the orientation of magnetic vectors within the memory cell and where such resistance variations are used to store data. As noted above, spin torque memory devices send a current through the magnetoresistive stack in order to store information in a memory cell. Depending on the direction of the current, and assuming it has adequate magnitude, the free portion of the memory cell will be forced into a corresponding magnetic state indicative of the information to be stored in the cell. As discussed above, the various sensing and writing operations in memory devices can require currents of different magnitudes and directions to flow through the memory cells.

FIG. 1 illustrates of magnetic memory apparatus that includes a memory cell 11. Memory cell 11 includes magnetic tunnel junction 21 coupled in series with selection transistor 31. The magnetic tunnel junction 21 has a first end corresponding to node 13 and a second end corresponding to node 14. The first end of the selection transistor 31 is coupled to the second end of the magnetic tunnel junction 21 at node 14. The second end of the selection transistor 31 is coupled to node 12. In some embodiments, nodes 12 and 13 are common lines such as a source line and a bit line, where such common lines are typically coupled to a large number of memory cells. Select circuits 41 and 42, which are controlled by inputs 46 and 47, respectively, enable drivers 51 and 52 to be selectively coupled to different bit lines and source lines as appropriate for the operation to be performed. Drivers 51 and 52 can be enabled by inputs 56 and 57.

In order to select the memory cell 11 from a plurality of memory cells coupled to the bit line 13 and the source line 12, word line 15 is asserted high such that selection transistor 31 allows current to be conducted through the series circuit formed by the selection transistor 31 and the magnetic tunnel junction 21. Selection transistor 31 is typically a thin oxide transistor, which, if subjected to a relatively high gate-to-source (Vgs) voltage, can breakdown and fail to operate properly. Such a failure is referred to as time-dependent dielectric breakdown. Thus, transistor 31 has a time-dependent dielectric breakdown voltage parameter that should not be exceeded in embodiments in which long-term functionality of the memory is desired. For example, the time-dependent dielectric breakdown voltage parameter for transistor 31 may be on the order of 1.6 V. As such, in order to avoid potential breakdown issues, the voltage on word line 15 should not be more than 1.6 V greater than the voltage at the source of transistor 31 (e.g. node 12 or node 14 depending on the direction of current flow).

While it is desirable to limit the gate-to-source voltage on transistor 31 in order to avoid breakdown, it is also desirable to maximize the drive strength of the transistor 31 by applying the maximum safe gate-to-source voltage on transistor 31. A higher gate-to-source voltage on transistor 31 enables more current to pass through the magnetic tunnel junction 21, thereby providing better performance in terms of read and write operations. The word line voltage applied to word line 15 is applied by word line driver 60. Word line driver 60 can apply multiple different voltages to word line 15, where the optimal word line voltage may be different for read (i.e. sense), down-current write (e.g. current flows through the magnetic tunnel junction 21 before transistor 31), and up-current write (e.g. current flows through the transistor 31 before magnetic tunnel junction 21) operations. In some embodiments, the word line voltage applied for read operations is the same as that applied for down-current write operations.

Word line driver 60 is coupled to word line voltage generator 70. Word line voltage generator 70 generates the plurality of possible word line voltages supplied to the word line driver 60. In some embodiments, word line voltage generator 70 is coupled to a single voltage supply, which may correspond to a voltage input to the memory device (e.g. at a pin or other external connection) or may correspond to a voltage supply generated on the memory using an externally supplied voltage. In some embodiments, the word line voltage generator 70 divides a received higher voltage to produce a lower voltage such that both the higher and lower voltages are available to drive the word line 15. In other embodiments, the word line voltage generator 70 uses a charge pump or other voltage generation circuit to boost a lower voltage and produce a higher voltage, where both the lower and higher voltages can be used by the word line driver 60 to drive the word line 15.

Control circuitry 80 is coupled to the word line driver and the other circuit elements shown in FIG. 1, where the control circuitry 80 is configured to provide the appropriate control signals to the various circuit blocks in order to cause the desired voltages to be applied and currents to flow through the magnetic tunnel junction 31. Control circuitry 80 may include, for example, a state machine, processor, microcontroller, or logic circuitry. Control circuitry 80 is used to select the appropriate word line voltage 15 to be applied by the word line driver 60. Control circuitry 80 can also enable drivers 51 and 52 via inputs 56 and 57 in order to cause those drivers 51 and 52 to drive desired voltages corresponding to read and write operations for the memory cell 11. Similarly, control circuitry 80 can enable select circuits 41 and 42 using inputs 46 and 47 in order to cause those select blocks to couple the drivers 51 and 52 to the appropriate bit lines and source lines.

During a down-current write in the context of the circuit shown in FIG. 1, a high voltage is placed on the bit line 13 by the driver 51 and a low voltage is placed on the source line 12 by the driver 52. If the word line 15 is driven to the appropriate word line voltage for a down current write, the voltage placed across the magnetic tunnel junction 21 results in sufficient current flow through the magnetic tunnel junction 21 such that the free portion of the magnetic tunnel junction 21 is forced into the state corresponding to that written by a down-current write. During such a down-current write, the bit line 13 is pulled to a high voltage by the driver 51, which may include NMOS-follower circuitry such as that shown in FIG. 2. Also during the down current write, the source line 12 is typically pulled to a low-voltage such as ground or a voltage close to ground by the driver 52. As discussed below with respect to FIG. 3, the source line 12 can be pulled low using PMOS follower circuitry, which, for example, can result in a voltage on the order of 0.1 V being driven on the source line 12. In other embodiments, the source line 12 is simply pulled to ground by a pass gate or transistor coupled to ground.

Figure 2:
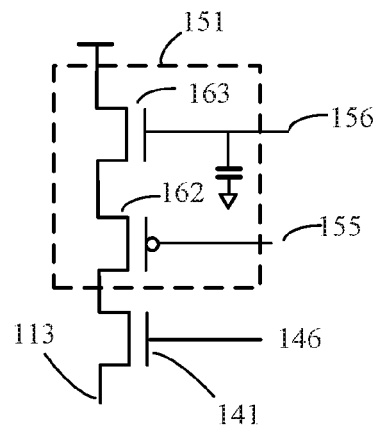
FIGS. 2 and 3 are schematic diagrams of driver circuits in accordance with exemplary embodiments.

FIG. 2 illustrates NMOS-follower circuitry 151 that includes NMOS-follower transistor 163 and switch transistor 162. The NMOS-follower circuitry 151 is coupled to the bit line or source line (bit/source line) 113 by column selection transistor 141, which corresponds to select circuit 41 in FIG. 1. When the gate 146 of column selection transistor 141 is pulled high, the NMOS-follower circuitry 151 is coupled to the bit/source line 113 such that it can drive a high voltage onto the bit/source line 113. As understood by one of ordinary skill in the art, the switch transistor 162 included in the NMOS-follower circuitry 151 is enabled by pulling the gate 155 of the switch transistor 162 low. The bias voltage 156 applied to the gate of the NMOS-follower transistor 163 controls the voltage level applied by the NMOS-follower circuitry 151. Thus, the switch transistor 162 works in a digital sense in that it is either off or on and thus either prevents or enables the NMOS-follower circuitry 151 to drive the bit/source line 113. In contrast, the NMOS-follower transistor 163 outputs different voltage levels based on the input bias signal 156 applied to the gate of the NMOS-follower transistor 163. As such, the NMOS-follower transistor 163 operates in the analog domain and does not behave as a simple switch. Such an NMOS-follower circuit 151 allows for very precise control of the voltage applied across the magnetic tunnel junction for read and write operations.

Figure 3:
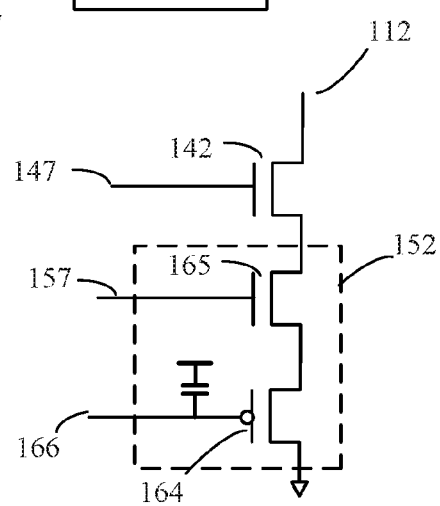

FIG. 3 illustrates PMOS-follower circuitry 152 that includes PMOS-follower transistor 164 and switch transistor 165. Like the NMOS-follower circuitry 151 of FIG. 2, the PMOS-follower circuitry 152 of FIG. 2 enables very precise control of the voltage applied across the magnetic tunnel junction during read and write operations. The PMOS-follower circuitry 152 is coupled to a bit/source line 112 by column selection transistor 142, which corresponds to select circuit 42 in FIG. 1. When the gate 147 of column selection transistor 142 is pulled high, the PMOS-follower circuitry 152 drives a low voltage onto the bit/source line 112. As understood by one of ordinary skill in the art, the switch transistor 165 included in the PMOS-follower circuitry 152 is enabled by pulling the gate 157 of the switch transistor 165 high. The bias voltage 166 applied to the gate of the PMOS-follower transistor 164 controls the voltage level applied by the PMOS-follower circuitry 152. Thus, the switch transistor 165 is either off or on, whereas the PMOS-follower transistor 164 will output different voltage levels corresponding to the input bias signal 166 applied to the gate of the PMOS-follower transistor 164, thereby enabling precise control of the voltage across the magnetic tunnel junction.

Referring back to FIG. 1, the gate-to-source voltage corresponding to selection transistor 31 is the voltage applied to the word line 15 minus the voltage on the source line 12. In the steady state before the writing operation begins, the bit lines and source lines on the memory are preferably pulled to either ground or a very low voltage in order to minimize leakage current. As such, if the source line 12 starts at ground, when the word line 15 is initially driven at the start of a down-current write operation, the gate-to-source voltage on the transistor 31 is essentially equal to the gate voltage driven on the transistor 31 by the word line 15.

In order to provide maximum current passage by the transistor 31 without causing potential breakdown, a word line voltage equal to the time-dependent dielectric breakdown voltage parameter for transistor 31 can be applied as the word line voltage for a down-current write. This is because the voltage on the source line 12 does not change significantly throughout the down-current write operation. The voltage on source line 12 starts are ground or close to ground, and, in embodiments that employ PMOS-follower circuitry to drive the source line 12, the voltage is only raised slightly to, for example, about 0.1 V. In embodiments that simply pull the source line 12 to ground, the voltage on the source line may remain constant throughout the down-current write operation. As such, the initial word line voltage applied to the gate of the selection transistor 31 for a down-current write operation allows for high-current flow through the transistor 31 without running afoul of the time-dependent dielectric breakdown voltage parameter for the transistor 31.

Figure 4:
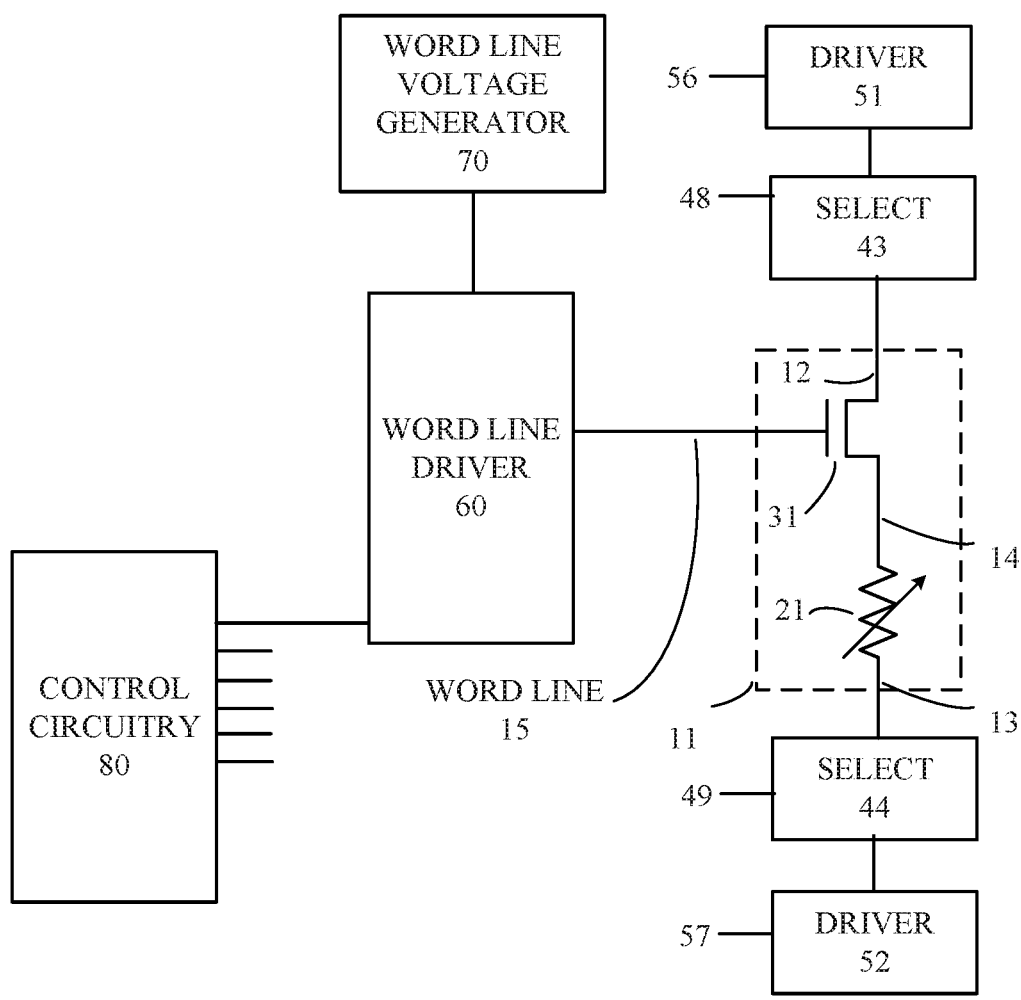
FIG. 4 is a block diagram corresponding to an up-current write in a spin-torque memory device in accordance with an exemplary embodiment.

FIG. 4 illustrates the circuitry of FIG. 1 rearranged and modified slightly to present the scenario corresponding to an up-current write operation. In FIG. 4, the driver 51, which is used to drive the high voltage with respect to establishing a voltage across the magnetic tunnel junction 21, is coupled to the source line 12 via select circuit 43 that is controlled by input 48. Similarly, the driver 52, which is used to drive the low voltage with respect to establishing a voltage across the magnetic tunnel junction 21, is coupled to the bit line 13 via select device 44, which is controlled by signal 49. In the up-current write scenario, the current flows through the selection transistor 31 before the magnetic tunnel junction 21. Thus, if the orientation of the magnetic tunnel junction 21 and selection transistor 31 in FIG. 4 was not inverted with respect to the orientation of FIG. 1, the current would be viewed as flowing in an upward direction.

In FIG. 4, the driver 52, which may include PMOS-follower circuitry, drives a low voltage on the bit lines 13 once the up-current write operation begins. Similarly, the driver 51, which may include NMOS-follower circuitry pulls the source line 12 to a high voltage once the up-current write operation begins. By applying the high voltage on the source line and the low voltage on the bit line, a voltage is established across the magnetic tunnel junction 21 sufficient to produce the needed current through the magnetic tunnel junction 21 to force the free portion of the magnetic tunnel junction 21 into the state corresponding to that established by an up-current write operation.

If the source line 12 and the bit line 13 are initially at ground or a very low voltage in the steady state condition before the up-current write operation begins, providing the optimal gate-to-source voltage on the transistor 31 is more complicated for an up-current write operation than in the down-current write operation. Once current flow through the memory cell 11 is initiated, a voltage drop appears across the magnetic tunnel junction 21. As such, the voltage at node 14, which is between the selection transistor 31 and the magnetic tunnel junction 21, is elevated above the low-voltage applied to the bit line 13. As such, in order to establish the maximum safe gate-to-source voltage on the transistor 31 during an up-current write operation, the word line 15 needs to be driven to a higher voltage level than that associated with the voltage applied on the word line 15 during a down-current write operation. As described above, the source of the transistor 31 during a down-current write operation is at a low voltage corresponding to the voltage applied to the source line 12. In contrast, during an up-current write operation, the voltage at the source of the transistor 31, which corresponds to node 14 in FIG. 4, is elevated above the bit line voltage 13 by the voltage drop across the magnetic tunnel junction 21. In an example embodiment, the voltage drop across the magnetic tunnel junction 21 is on the order of 0.5 V. As such, if the same word line voltage is applied to the word line 15 for the up-current write as is applied to the word line 15 during the down-current write (i.e. 1.6V), the gate-to-source voltage on transistor 31 would be approximately 1.1 V (1.6V−0.5V=1.1V), which is well below the maximum safe gate-to-source voltage. Because the source node for transistor 31 is elevated during the up-current write operation, if the gate voltage on transistor 31 is not also elevated to compensate, the gate-to-source voltage for the transistor 31 is lower than optimal and may not be sufficient to support the current needed to cause the free portion of the magnetic tunnel junction 21 to change state.

Thus, to support the needed write current, a higher word line voltage is applied during the up-current write operation in order to enable sufficient current flow to change the state of the magnetic tunnel junction 21. However, if the higher word line voltage is driven when the up-current write operation is initiated, the time-dependent dielectric breakdown voltage parameter for the transistor 31 may be violated. In order to establish the optimal word line voltage to be driven on the word line 15 for the up-current write operation, the voltage that will be dropped across the magnetic tunnel junction 21 needs to be added to the voltage on the bit line 13 during the up-current write operation, where that sum is then added to the desired gate-to-source voltage for the transistor 31 in order to arrive at the needed voltage to be applied on the word line 15. In the example presented, if the bit line 13 is driven to 0.1 V by the driver 52 and the expected voltage drop across the magnetic tunnel junction 21 is 0.5 V, then in order to achieve a 1.5 V gate-to-source voltage on the transistor 31, the word line 15 is driven to 2.1 V.

As noted above, at the outset of the up-current write operation, the bit line 13 and source line 12 are preferably held at ground or at a very low voltage. As such, if 2.1 V is applied to the word line 15 before current begins flowing through the magnetic tunnel junction 21, the gate-to-source voltage on the transistor 31 will be on the order of 2.1 V, thereby violating the time-dependent dielectric breakdown parameter for the transistor 31. In order to avoid this problem, the word line 15 can be driven in multiple steps, where an initial voltage on the word line 15 enables current to flow through the selection transistor 31 and thus through the magnetic tunnel junction 21 in order to establish the higher voltage at the node 14 before a higher word line voltage is driven on the word line 15. In one example, in a first stage of the up-current write operation, the word line 15 is initially driven to the word line voltage used for down-current writes in order to allow current flow through the magnetic tunnel junction 21 thereby elevating the node 14 to the higher voltage (e.g. 0.6 V). Once the node 14 has reached the elevated voltage level, the word line voltage can be stepped-up to the voltage level needed to provide the gate-to-source voltage needed to support the write current through the magnetic tunnel junction 21 during the up-current write operation (e.g. 2.1 V).

Stepping through the various voltages applied within the circuitry of FIG. 4 during an up-current write under the control of control circuitry 80 can help to illustrate the staggered word line voltage application technique. Initially, the bit line 13 and the source line 12 are at ground in the steady-state resting condition in order to minimize current leakage. As such, node 14 is also ground as no current flows through the magnetic tunnel junction 21. The select circuits 44 and 43 are then enabled in order to select the memory cell 11 from the plurality of memory cells coupled to the bit line 13 and source line 12. The word line driver 60 applies an initial word line voltage on the word line 15 in order to turn on the selection transistor 31. As discussed above, the initial voltage applied to the word line 15 can be the voltage applied to the word line 15 during a down-current write operation, as that voltage is within the range of the time dependent dielectric breakdown voltage parameter for the transistor 31 when the source node of transistor 31 is at ground. Once the selection transistor is turned on based on the application of the down-current write word line voltage, the drivers 51 and 52 are used to drive the voltage across the memory cell 11, thereby resulting in an initial level of current flow through the magnetic tunnel junction 21 that results in a voltage drop across the magnetic tunnel junction 21. The voltage drop across the magnetic tunnel junction 21 raises the voltage at the node 14 such that when the word line 15 is subsequently driven to the higher-magnitude second word line voltage needed to support the up-current write operation, the gate-to-source voltage across the selection transistor 31 does not violate the time-dependent dielectric breakdown voltage parameter for the selection transistor 31.

While the example embodiments discussed above raise the word line 15 to an initial voltage level corresponding to the voltage level used for a down-current write operation prior to later elevating the voltage on the word line 15 to a higher voltage used for the up-current write operation, in other embodiments, the voltage on the word line 15 can be raised to the needed level in more than two steps. For example, the word line 15 can be gradually driven to the word line voltage needed for the up-current write operation, which in some embodiments can be accomplished in multiple discrete steps. In other embodiments, the initial voltage applied to the word line 15 is a voltage other than the voltage applied to the gate of transistor 31 during a down-current write operation while still being low enough as to not cause breakdown of the select transistor.

Figure 5:
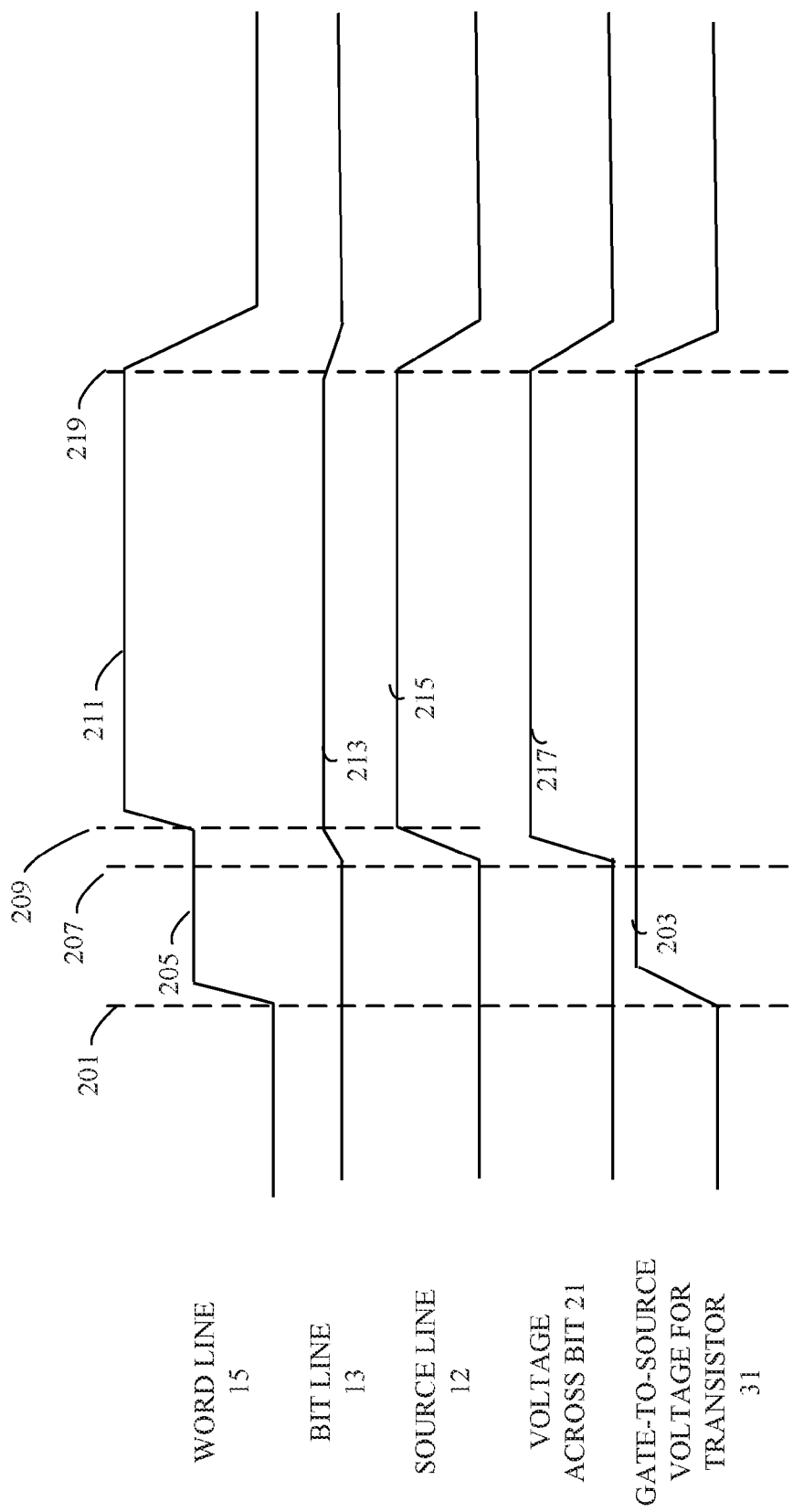
FIG. 5 is a timing diagram associated with the circuitry of FIG. 4 during an up-current write in a spin-torque memory device in accordance with an exemplary embodiment.

FIG. 5 illustrates a timing diagram corresponding to some of the signals associated with an up-current write operation in the context of the embodiment illustrated in FIG. 4. Initially, the word line 15, bit line 13, and source line 12 are all at a low voltage, which may be ground. As a result, there is no voltage across the bit 21, and the gate-to-source voltage for transistor 31 is zero. At time 201, the word line driver circuitry 60 applies a first word line voltage 205 to the gate of selection transistor 31, where the first word line voltage 205 enables current to flow through the magnetic tunnel junction 21 and the selection transistor 31. When the word line 15 is driven to the first word line voltage 205 at time 201, the gate-to-source voltage for the transistor 31 is elevated to a voltage 203. Assuming the bit line 13 is initially at ground, the gate-to-source voltage for transistor 31 after time 201 will be the same as the first word line voltage 205 applied on the word line 15. As noted above, first word line voltage 205 should be a voltage at or below the time dependent dielectric breakdown voltage parameter for the selection transistor 31. Thus a difference between the first word line voltage 205 and the voltage at the second end of the selection transistor when the first word line voltage 205 is applied also does not exceed the time-dependent dielectric breakdown voltage parameter for the selection transistor.

Once the word line 15 is driven to the first word line voltage 205, a first voltage is applied across the magnetic tunnel junction using the first driver circuitry 51 and the second driver circuitry 52, where applying the first voltage across the magnetic tunnel junction 21 raises the voltage at the second end 14 of the selection transistor 31 to a raised source voltage. In the example discussed above, the raised source voltage corresponds to the voltage drop across the magnetic tunnel junction plus any voltage established at the bit line 13 by the driver 52. In FIG. 5, at time 207, the bit line 13 is raised to a voltage 213 that is slightly above ground (e.g. on the order of 0.1 V), while the driver 51 drives the source line 12 to a higher voltage 215. Thus, at time 207, the switch transistors included in the drivers 51 and 52 can be enabled such that the follower transistors in those drivers are enabled to apply the voltages 213 and 215 to the bit line and a source line, respectively. As the voltage is applied across the magnetic tunnel junction, the voltage across bit 21 shown in FIG. 5 is elevated to a voltage 217.

At time 209, once the voltage at the second end of the selection transistor has been raised to the raised source voltage, the word line driver circuitry is used to apply a second word line voltage 211 to the gate of the selection transistor 31. Because the source of the selection transistor 31 has been raised to the raised source voltage level, the difference between the second word line voltage 211 and the raised source line voltage does not exceed the time-dependent dielectric breakdown voltage parameter for the selection transistor 31. Note that the timing diagram illustrated in FIG. 5 is simplified in that it does not show a potential dip in the gate-to-source voltage for transistor 31 that would occur as the voltage across the bit 21 is raised to voltage level 217. With the gate-to-source voltage for transistor 31 at the optimal level for the up-current write, the up-current write operation can proceed until time 219 at which the various signals are returned to ground in the steady state.

Figure 6:
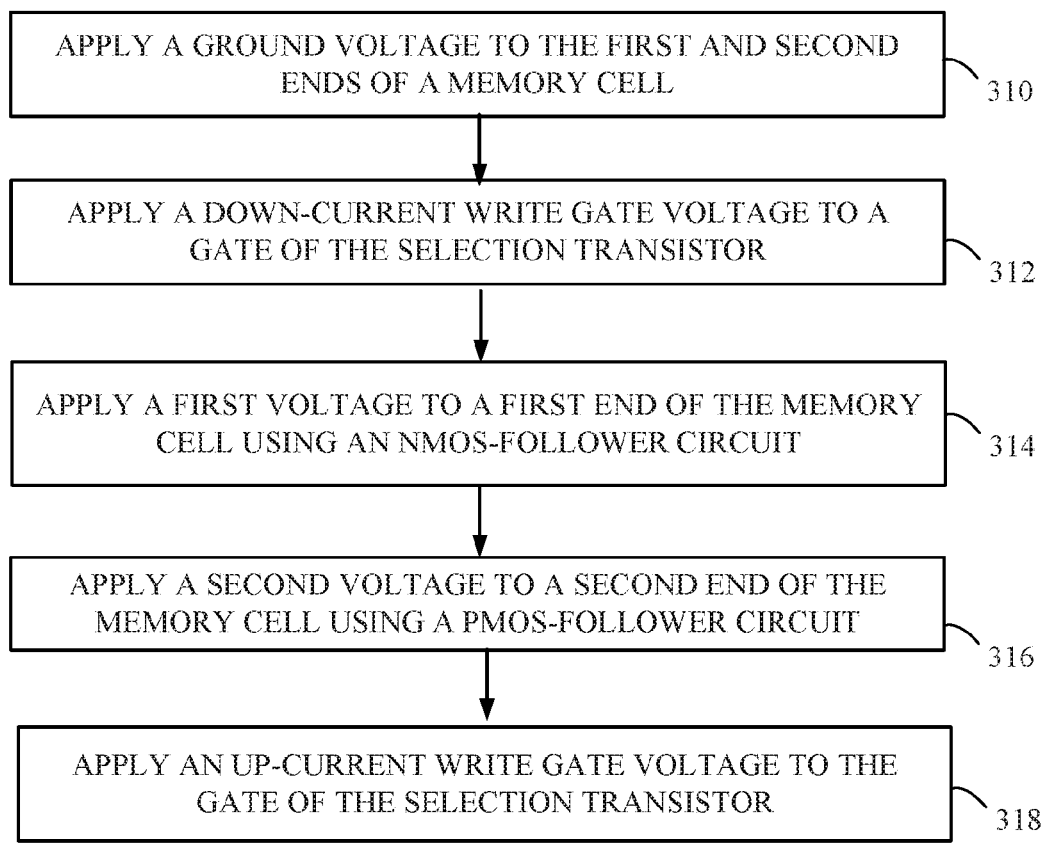
FIGS. 6 and 7 are flow charts corresponding to methods for performing an up-current write operation in memory in accordance with exemplary embodiments.
Figure 7:
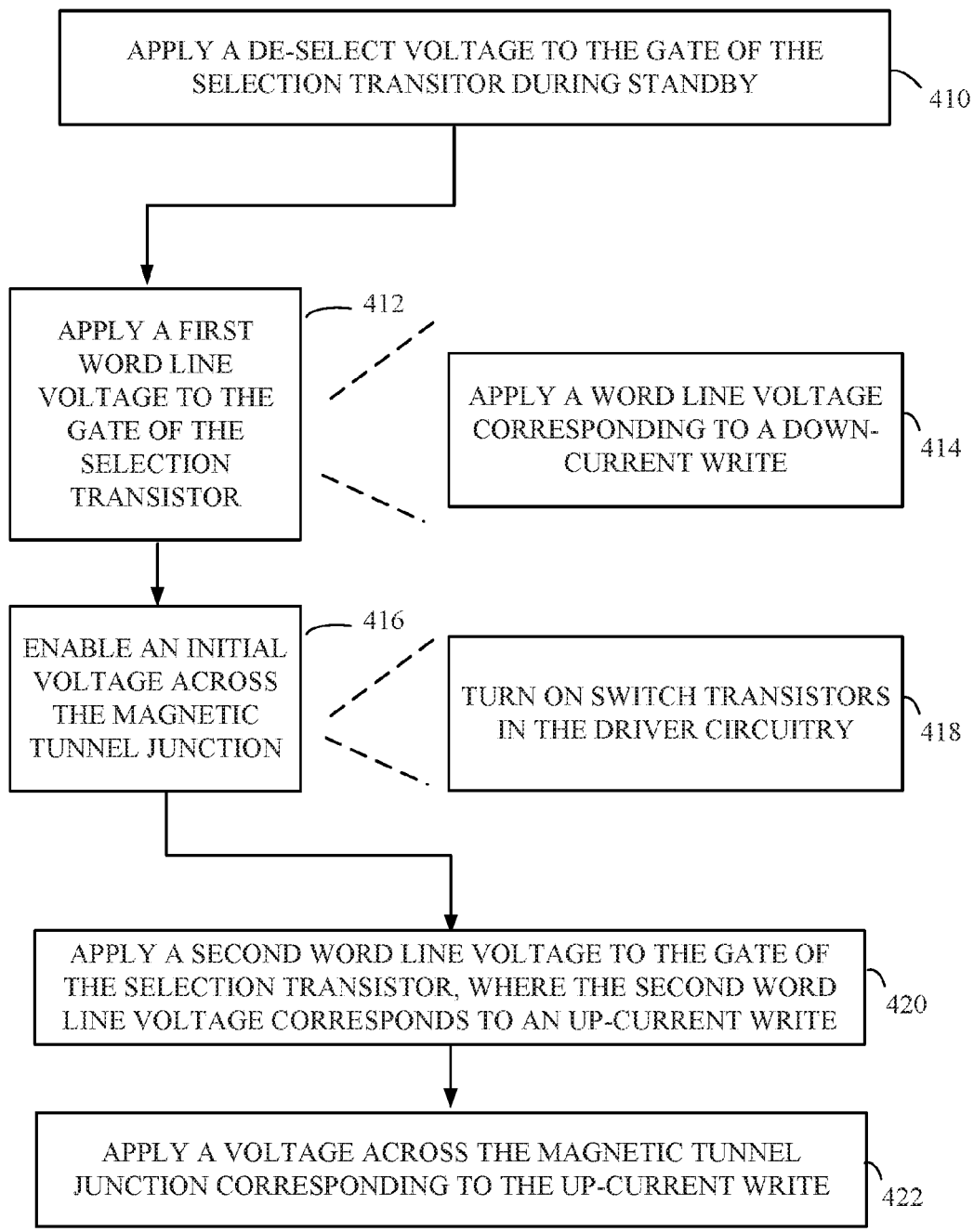

FIGS. 6 and 7 are flow charts that illustrate exemplary embodiments or aspects of embodiments of methods for writing to a magnetic memory cell. In one example, the magnetic memory cell is included in a memory device or embedded memory application that includes an array of spin-torque magnetic tunnel junction memory cells. The operations included in the flow charts may represent only a portion of the overall process used in operating the device. For illustrative purposes, the following description of the methods in FIGS. 6 and 7 may refer to elements mentioned above in connection with FIGS. 1-5. It should be appreciated that methods may include any number of additional or alternative tasks, the tasks shown in FIGS. 6 and 7 need not be performed in the illustrated order, and the methods may be incorporated into a more comprehensive procedure or process having additional functionality not described in detail herein. Moreover, one or more of the tasks shown in FIGS. 6 and 7 could be omitted from an embodiment as long as the intended overall functionality remains intact.

FIG. 6 illustrates a flow chart of a method for writing to a magnetic memory cell, where the magnetic memory cell includes a selection transistor coupled in series with the magnetic tunnel junction. As depicted and described with respect to FIG. 4 above, the magnetic memory cell includes a first end that corresponds to a first end of the selection transistor. The second end of the magnetic memory cell corresponds to a second end of the magnetic tunnel junction, and the second end of the selection transistor is coupled to the first end of the magnetic tunnel junction. As also discussed above, in a standby or steady-state condition the selection transistor is deselected by applying a de-select voltage (e.g. ground) to the gate of the selection transistor such that it is turned off. Similarly, at 310 the ends of the magnetic memory cell are also held at ground in order to avoid leakage currents.

At 312, a down-current write gate voltage is applied to the gate of the selection transistor, where the down-current write gate voltage is the gate voltage typically applied to the selection transistor during a down-current write operation. However, in this instance, the down-current write gate voltage is applied in order to gradually step up the voltage applied at the gate of the selection transistor such that the higher gate voltage needed for an up-current write operation can be applied to the gate of the selection transistor without violating the time-dependent dielectric breakdown voltage parameter for the selection transistor. The down-current write gate voltage applied to the gate of the selection transistor may not be enough to support the up-current write operation, but it does allow current to flow through the magnetic memory cell.

At 314, a first voltage is applied to the first end of the memory cell and a second voltage is applied to the second end of the memory cell. As discussed above, in some embodiments the first voltage applied to the first end of the memory cell is applied using a driver that includes NMOS-follower circuitry. The NMOS-follower circuitry can be enabled using a switch transistor that is turned on at 314. Similarly, the second voltage applied to the second end of the memory cell can be applied using a driver that includes PMOS-follower circuitry, which can also be enabled with a switch transistor.

As discussed above, once the word line has been driven to the voltage corresponding to the down-current write word line voltage, current can flow through the magnetic tunnel junction. As such, once the drivers are enabled, a voltage drop will appear across the magnetic tunnel junction, thereby raising the source of the selection transistor to an elevated voltage level. Because the source of the selection transistor is no longer at ground once current begins flowing through the magnetic tunnel junction, the voltage on the word line can then be raised to a higher level without violating the time-dependent dielectric breakdown voltage parameter for the selection transistor. As such, at 318 an up-current write gate voltage is applied to the gate of the selection transistor, where the up-current write gate voltage is greater than the down-current write gate voltage and provides sufficient gate-to-source voltage on the selection transistor to enable sufficient up-current to flow through the magnetic tunnel junction, thereby forcing it into the desired state.

By initially driving the word line to the down-current write gate voltage to allow current to flow through the magnetic tunnel junction before raising the gate voltage on the selection transistor to the up-current write gate voltage, the full gate-to-source voltage can be realized on the selection transistor without over driving the selection transistor in a manner that violates the time-dependent dielectric breakdown voltage parameter. By using the down current write gate voltage as the initial voltage applied to the selection transistor, the word line voltage generation circuitry can be simplified in terms of the number of different voltages it is required to generate. The up-current write gate voltage can be generated such that it is the down current write gate voltage plus the voltage drop across the magnetic tunnel junction while the up-current write gate voltage is applied to the gate of the selection transistor. Thus, the maximum safe gate-to-source voltage can be applied during both down-current write and up-current write operations.

FIG. 7 illustrates another method for writing to magnetic memory cell that includes a selection transistor coupled in series with magnetic tunnel junction, where the magnetic tunnel junction is understood to be coupled to the selection transistor in the same manner as discussed above with respect to FIGS. 4 and 6. At 410, a de-select voltage is applied to the gate of the selection transistor during standby such that the selection transistor does not allow current flow through the magnetic tunnel junction. The bit lines and source lines for the memory are also preferably maintained in the ground or near-ground state during standby.

At 412 a first word line voltage is applied to the gate of the selection transistor. In some embodiments, at 414 the first word line voltage applied is the same word line voltage applied during a down current write operation. In other embodiments, the first word line voltage applied to the gate of selection transistor at 412 can be another voltage that is sufficient to allow current flow through the magnetic tunnel junction yet low enough to be below a predetermined stress voltage level for the selection transistor. In some embodiments, the predetermined stress level for the selection transistor corresponds to the time-dependent dielectric breakdown voltage parameter for the selection transistor.

At 416 an initial voltage is enabled across the magnetic tunnel junction while the first word line voltage is applied to the gate of the selection transistor. Thus, with the first word line voltage on the gate of the selection transistor current flow is established through the magnetic tunnel junction as a result of the initial voltage enabled across the memory cell. The voltage across the memory cell can be enabled by turning on the switch transistors in the driver circuitry at 418. For example, if NMOS-follower circuitry is used to provide a high voltage at one end of the memory cell, the switch transistor included in the NMOS-follower circuitry is turned on at 418 in order to enable the NMOS-follower transistor to provide the desired voltage at the bit/source line coupled to the end of the memory cell. As the current flows through the magnetic tunnel junction within the memory cell, the second end of the selection transistor, which is coupled to the first end of the magnetic tunnel junction, is raised from the low standby voltage to a raised source voltage that includes the voltage drop across the magnetic tunnel junction as a result of the current flowing through it. In some embodiments, a voltage applied across the memory cell at 416 corresponds to the voltage to be applied across the memory cell during an up-current write operation. However, because the word line voltage has not yet been driven to the higher voltage level, which occurs at 420, the actual voltage across the magnetic tunnel junction may be less than that needed to accomplish the up-current write.

At 420, after the voltage at the second end of the selection transistor has been raised to the raised source voltage, a second word line voltage is applied to the gate of the selection transistor, where the second word line voltage is greater than the first word line voltage and corresponds to the word line voltage needed to support an up-current write operation. A difference between the second word line voltage and the raised source line voltage is also below the predetermined stress voltage level for the selection transistor such that the application of the second word line voltage does not overdrive the selection transistor in a manner that could potentially cause it to break down. In embodiments where the voltage corresponding to an up-current write is being applied across the memory cell, the increase in the word line voltage results in a higher voltage being applied across the magnetic tunnel junction as the selection transistor with the higher word line voltage can supply greater current. As such, the higher word line voltage being applied at 420 can result in the voltage across the magnetic tunnel junction being raised to the level corresponding to the up-current write with no other changes to the signals or voltages being provided to the memory cell.

At 422, a voltage is applied across the magnetic tunnel junction corresponding to the voltage needed to support an up-current write so that the free portion of the magnetic tunnel junction is forced into a first state. As noted directly above, in some embodiments, the application of the voltage at 422 follows from the application of the second word line voltage at 420 and does not require an increase in the voltage levels applied to the memory cell as a whole. In other embodiments, the voltage across the memory cell can be increased at 422 such that two different voltages are applied across the memory cell at 416 and 420. If the up-current write forces the magnetic tunnel junction to the first state, a down-current write forces the free portion of the magnetic tunnel junction to a second state. From the steady state in which the gate of the selection transistor is ground and the bit lines and source lines are ground, such a down-current write operation is facilitated by applying the first word line voltage (e.g. down current write word line voltage) to the gate of the selection transistor. Because the first word line voltage is below the predetermined stress voltage level, even though the source of the selection transistor is ground, the first word line voltage can be applied without violating the predetermined stress voltage level for the selection transistor. Once the gate of the selection transistor has been driven the first word line voltage, a down current write voltage can be enabled across the memory cell, where the down current write voltage results in current flowing through the memory cell that forces the free portion of the magnetic tunnel junction to the second state.

In order to support the word line voltage needed on the gate of the select transistor for an up-current write operation without exceeding limits on the gate-to-source voltage for the select transistor, the gate of the selection transistor can be driven in a two-step process. The gate of the selection transistor is first driven to a lower voltage within the limits of the gate-to-source voltage for the transistor when the source of the transistor is grounded or at a voltage near ground. A voltage is then applied across the memory cell, which results in the source of the selection transistor being raised above its initial ground or near-ground state. After the source of the selection transistor has been raised, the gate voltage can also be raised at least as much as the source of the selection transistor has been elevated without violating the limits on the gate-to-source voltage for the selection transistor.

While exemplary embodiments have been presented above, it should be appreciated that many variations exist. Furthermore, while the description uses spin-torque MRAM devices that include memory cells in a specific example arrangements, the teachings may be applied to other memory devices having different architectures in which the same concepts can be applied.

The particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A method for writing to a magnetic memory cell that includes a selection transistor coupled in series with a magnetic tunnel junction, the method comprising:
   applying a de-select voltage to a gate of the selection transistor while a voltage at a second end of the selection transistor is a low standby voltage, wherein:
      a first end of the magnetic memory cell corresponds to a first end of the selection transistor;
      the second end of the magnetic memory cell corresponds to a second end of the magnetic tunnel junction; and
      a second end of the selection transistor is coupled to a first end of the magnetic tunnel junction;
   applying a first word line voltage to the gate of the selection transistor, wherein a difference between the first word line voltage and the low standby voltage is below a predetermined stress voltage level for the selection transistor;

while applying the first word line voltage, enabling an initial voltage across the memory cell such that the voltage at the second end of the selection transistor is raised from the low standby voltage to a raised source voltage that includes a voltage across the magnetic tunnel junction;

after the voltage at the second end of the selection transistor is raised to the raised source voltage, applying a second word line voltage to the gate of the selection transistor, wherein a difference between the second word line voltage and the raised source voltage is below the predetermined stress voltage level for the selection transistor; and while applying the second word line voltage, applying a voltage across the magnetic memory cell that forces a free portion of the magnetic memory cell to a first state as a part of a first writing operation.

2. The method of claim 1, wherein the predetermined stress voltage level corresponds to a time-dependent dielectric breakdown voltage for the selection transistor.

3. The method of claim 1, wherein the de-select voltage and the low standby voltage are ground.

4. The method of claim 1, wherein enabling the initial voltage across the memory cell further comprises enabling a first switch transistor in an NMOS-follower circuit that includes the first switch transistor and an NMOS-follower transistor, wherein the NMOS-follower circuit is coupled to the first end of the magnetic memory cell.

5. The method of claim 4, wherein enabling the initial voltage across the memory cell further comprises:
prior to enabling the switch transistor, selecting the magnetic memory cell from a plurality of magnetic memory cells using column selection circuitry.

6. The method of claim 4, wherein enabling the initial voltage across the memory cell further comprises enabling a second switch transistor in a PMOS-follower circuit that includes the second switch transistor and a PMOS-follower circuit, wherein the PMOS-follower circuit is coupled to the second end of the magnetic memory cell.

7. The method of claim 1, further comprising performing a second writing operation that includes:
reapplying the de-select voltage to the gate of the selection transistor while the voltage at a second end of the selection transistor is the low standby voltage;
reapplying the first word line voltage to the gate of the selection transistor; and
while reapplying the first word line voltage, enabling a down-current write voltage across the memory cell that forces the free portion of the magnetic tunnel junction to a second state.

8. The method of claim 1, further comprising generating the first word line voltage and the second word line voltage from a common voltage supply.

9. A method for performing an up-current write for a magnetic memory cell that includes a selection transistor coupled in series with a magnetic tunnel junction, the method comprising:
applying a ground voltage to a first end of the magnetic memory cell and a second end of the magnetic memory cell, wherein:
a first end of the magnetic memory cell corresponds to a first end of the selection transistor;
the second end of the magnetic memory cell corresponds to a second end of the magnetic tunnel junction; and
a second end of the selection transistor is coupled to a first end of the magnetic tunnel junction;
applying a down-current write gate voltage to a gate of the selection transistor, wherein the down-current write gate voltage allows current to flow through the magnetic memory cell;
while applying the down-current write gate voltage to the gate of the selection transistor, applying a first voltage to the first end of the magnetic memory cell and applying a second voltage to the second end of the memory cell;
while applying the first and second voltages, applying an up-current write gate voltage to the gate of the selection transistor, wherein the up-current write gate voltage is greater than the down-current write gate voltage.

10. The method of claim 9, wherein a difference between the down-current write gate voltage and the up-current write gate voltage corresponds to a voltage drop across the magnetic tunnel junction while the up-current write gate voltage is applied to the gate of the selection transistor.

11. The method of claim 9, wherein applying the first voltage further comprises applying the first voltage using an NMOS-follower circuit, wherein the first voltage is greater than the second voltage.

12. The method of claim 11, wherein applying the second voltage further comprises applying the second voltage by pulling the second end of the memory cell to ground.

13. The method of claim 11, wherein applying the second voltage further comprises applying the second voltage using a PMOS-follower circuit.

14. The method of claim 9, wherein applying the down-current write gate voltage to the gate of the selection transistor further comprises applying the down-current write gate voltage such that a difference between the down-current write gate voltage on the gate of the selection transistor and a voltage at the second end of the selection transistor does not exceed a time-dependent dielectric breakdown voltage parameter for the selection transistor.

15. A magnetic memory apparatus, comprising:
a selection transistor having a first end, a second end, and a gate;
a magnetic tunnel junction having a first end and a second end, wherein the first end of the magnetic tunnel junction is coupled to the second end of the selection transistor;
first driver circuitry to drive a first voltage on a first line coupled to a first end of the selection transistor;
second driver circuitry to drive a second voltage on a second line coupled to the second end of the magnetic tunnel junction;
word line driver circuitry coupled to the gate of the selection transistor; and
control circuitry coupled to the first driver circuitry, the second driver circuitry, and the word line driver circuitry, the control circuitry configured to:
apply, using the word line driver circuitry, a first word line voltage to the gate of the selection transistor, wherein the first word line voltage enables current to flow through the magnetic tunnel junction and the selection transistor, wherein a difference between the first word line voltage and a voltage at the second end of the selection transistor when the first word line voltage is first applied does not exceed a time-dependent dielectric breakdown voltage parameter for the selection transistor;

while applying the first word line voltage, apply a first voltage across the magnetic tunnel junction using the first driver circuitry and the second driver circuitry, where applying the first voltage raises the voltage at the second end of the selection transistor to a raised source voltage; and when the voltage at the second end of the selection transistor is the raised source voltage, apply, using the word line driver circuitry, a second word line voltage to the gate of the selection transistor, wherein a difference between the second word line voltage and the raised source voltage at the second end of the selection transistor does not exceed the time-dependent dielectric breakdown voltage parameter for the selection transistor.

16. The apparatus of claim 15, further comprising:
first column selection circuitry coupled between the first driver circuitry and the first line; and
second column selection circuitry coupled between the second driver circuitry and the second line.

17. The apparatus of claim 15, wherein the first driver circuitry includes an NMOS-follower transistor coupled in series with a first switch transistor.

18. The apparatus of claim 17, wherein the second driver circuitry includes a PMOS-follower transistor coupled in series with a second switch transistor.

19. The apparatus of claim 17, wherein the second driver circuitry includes a transistor coupled between the second line and ground.

20. The apparatus of claim 15, further comprising a word line voltage generator coupled to the word line driver circuitry, wherein the word line voltage generator generates the first word line voltage and the second word line voltage from a voltage supply.

* * * * *